(12) United States Patent
Sumi

(10) Patent No.: US 11,955,350 B2
(45) Date of Patent: Apr. 9, 2024

(54) SUBSTRATE PROCESSING APPARATUS

(71) Applicant: SCREEN Holdings Co., Ltd., Kyoto (JP)

(72) Inventor: Noritake Sumi, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 576 days.

(21) Appl. No.: 17/219,931

(22) Filed: Apr. 1, 2021

(65) Prior Publication Data
US 2021/0313198 A1 Oct. 7, 2021

(30) Foreign Application Priority Data

Apr. 2, 2020 (JP) ................................ 2020-066516

(51) Int. Cl.
| | |
|---|---|
| H01L 21/67 | (2006.01) |
| F26B 5/00 | (2006.01) |
| H01L 21/02 | (2006.01) |
| H01L 21/677 | (2006.01) |

(52) U.S. Cl.
CPC ........ *H01L 21/67017* (2013.01); *F26B 5/005* (2013.01); *H01L 21/67748* (2013.01); *H01L 21/02101* (2013.01)

(58) Field of Classification Search
CPC ......... H01L 21/67017; H01L 21/67748; H01L 21/02101; F26B 5/005
USPC .................................................... 34/90, 341
See application file for complete search history.

(56) References Cited

U.S. PATENT DOCUMENTS

| | | | | |
|---|---|---|---|---|
| 5,608,974 A | * | 3/1997 | Tanaka | F26B 21/145 118/69 |
| 6,602,348 B1 | * | 8/2003 | Rogelstad | H01L 21/67109 156/345.31 |
| 6,905,585 B2 | * | 6/2005 | Goncalves | G01N 27/44773 204/616 |

(Continued)

FOREIGN PATENT DOCUMENTS

| | | | | |
|---|---|---|---|---|
| CN | 113496921 A | * | 10/2021 | ............. F26B 5/005 |
| JP | H09-232266 A | | 9/1997 | |

(Continued)

OTHER PUBLICATIONS

Notice of Allowance dated Aug. 17, 2022 for the corresponding Korean Patent Application No. 10-2021-0042604 with translation.

(Continued)

*Primary Examiner* — Stephen M Gravini
(74) *Attorney, Agent, or Firm* — OSTROLENK FABER LLP

(57) ABSTRACT

An upper flow passage 181 is connected to a buffer space 182. The upper flow passage 181 has a constant cross-sectional shape and a processing fluid flows as a laminar flow in the upper flow passage 181. On the other hand, the buffer space 182 has a larger flow passage cross-sectional area than the upper flow passage 181. Thus, the processing fluid flowing in the upper flow passage 181 is released at once into the wide buffer space 182, whereby the pressure of the processing fluid decreases. A backflow of the processing fluid from the buffer space 182 to the upper flow passage 181 is prevented due to this pressure difference and the magnitude of a flow passage resistance of the upper flow passage 181 viewed from the buffer space 182.

8 Claims, 6 Drawing Sheets

(56) References Cited

U.S. PATENT DOCUMENTS

| | | | |
|---|---|---|---|
| 9,536,797 B2* | 1/2017 | Igarashi | H01L 22/26 |
| 10,119,191 B2* | 11/2018 | Morey | C23C 14/566 |
| 10,204,777 B2* | 2/2019 | Namba | H01L 21/02019 |
| 10,366,908 B2* | 7/2019 | Yoshida | H01L 21/67742 |
| 10,643,825 B2* | 5/2020 | Tetsuka | H01J 37/32449 |
| 11,289,324 B2* | 3/2022 | Okutani | B08B 3/04 |
| 11,715,649 B2* | 8/2023 | Sumi | B08B 7/0021 134/200 |
| 2004/0183640 A1 | 9/2004 | Bohler et al. | 336/182 |
| 2006/0213436 A1 | 9/2006 | Ohmi et al. | 118/715 |
| 2007/0120222 A1 | 5/2007 | Ode | 257/532 |
| 2008/0223415 A1 | 9/2008 | Parks | 134/34 |
| 2012/0266925 A1 | 10/2012 | Nakashima et al. | 134/200 |
| 2015/0275357 A1 | 10/2015 | Kamakura et al. | |
| 2017/0084469 A1 | 3/2017 | Lee et al. | |
| 2018/0138060 A1 | 5/2018 | Okamura et al. | |
| 2018/0358242 A1 | 12/2018 | Kim et al. | |
| 2021/0313198 A1* | 10/2021 | Sumi | H01L 21/67034 |

FOREIGN PATENT DOCUMENTS

| | | | | |
|---|---|---|---|---|
| JP | 2006-303316 A | | 11/2006 | |
| JP | 2008-073611 A | | 4/2008 | |
| JP | 2018-082043 A | | 5/2018 | |
| JP | 2018-207076 A | | 12/2018 | |
| JP | 2018-207103 A | | 12/2018 | |
| JP | 2021163915 A | * | 10/2021 | F26B 5/005 |
| KR | 10-1069567 B1 | | 10/2011 | |
| KR | 10-2012-0119995 A | | 11/2012 | |
| KR | 20140020752 A | * | 7/2013 | |
| KR | 10-2015-0111812 A | | 10/2015 | |
| KR | 10-2018-0125763 A | | 11/2018 | |
| TW | 565863 | | 12/2003 | |
| TW | 202141613 A | * | 11/2021 | F26B 5/005 |

OTHER PUBLICATIONS

Taiwanese Office Action dated Jan. 4, 2022 for corresponding Taiwanese Patent Application No. 110111705.

Japanese Notice of Allowance dated Oct. 31, 2023 issued in corresponding Japanese Patent Application No. 2020-066516. Machine translation attached.

* cited by examiner

FIG. 6B  COMPARATIVE EXAMPLE

SUBSTRATE PROCESSING APPARATUS

CROSS REFERENCE TO RELATED APPLICATION

The disclosure of Japanese Patent Application No. 2020-066516 filed on Apr. 2, 2020 including specification, drawings and claims is incorporated herein by reference in its entirety.

BACKGROUND OF THE INVENTION

1. Field of the Invention

This invention relates to a substrate processing apparatus for processing a substrate by a processing fluid in a chamber.

2. Description of the Related Art

A processing process of various substrates such as semiconductor substrates and glass substrates for display device includes processing the surface of the substrate by various processing fluids. Processes using liquids such as chemical liquids and rinse liquids as the processing fluids have been conventionally widely performed. In recent years, processes using supercritical fluids have been also put to practice. Particularly, in a process of a substrate having a fine pattern formed on a surface, a supercritical fluid having a lower surface tension than a liquid enters deep into clearances of the pattern. Thus, the process can be efficiently performed and an occurrence risk of pattern collapse due to a surface tension during drying can be reduced.

For example, a substrate processing apparatus for performing a process of drying a substrate using a supercritical fluid is described in JP 2018-082043A. In this apparatus, a processing container is configured in which two plate-like members are arranged to face each other and a clearance therebetween functions as a processing space. A wafer (substrate) placed on a thin holding plate is carried in from one end part of the processing space, and carbon dioxide in a supercritical state is introduced from the other end part.

The processing container used in this type of process is one type of a high-pressure chamber. The chamber is provided with an aperture for taking in and out the substrate, and the processing space is formed by closing this aperture by a lid part. An elastic sealing member, for example, made of rubber is interposed between the chamber and the lid part, whereby the airtightness of the processing space is maintained.

SUMMARY OF INVENTION

In the chamber as described above, it is structurally unavoidable that a part of the sealing member is exposed to a space communicating with the processing space and contacts the processing fluid. Thus, components included in the sealing member may be mixed into the processing fluid, and such mixed components may adhere to the substrate to contaminate the substrate. For example, carbon dioxide often used as a supercritical processing fluid for substrate processing has a property of dissolving organic matters well, and a resin material such as rubber used as the sealing member dissolves into the processing fluid.

From this, a measure for avoiding adhesion to the substrate even if the components are mixed into the processing fluid from the sealing member is desired. However, this problem has not been addressed in the above conventional technique.

This invention was developed in view of the above problem and an object thereof is to provide a technique capable of effectively preventing the contamination of a substrate by impurities mixed from a sealing member in a substrate processing apparatus for processing the substrate by a processing fluid in a chamber.

One aspect of this invention is directed to a substrate processing apparatus for processing a surface of a substrate by a processing fluid, the substrate processing apparatus including, to achieve the above object, a substrate holder in the form of a flat plate, the substrate being placeable in a horizontal posture on an upper surface of the substrate holder, a chamber including a processing space capable of accommodating the substrate holder having the substrate placed thereon and a side surface having an aperture that communicates with the processing space and allows the substrate holder to pass through, and a lid part configured to close the aperture by coming into contact with the chamber via a sealing member. Here, the substrate holder projects on a side surface of the lid part on the chamber side, and the lid part closes the aperture with the substrate holder inserted in the processing space.

The chamber is provided with an introduction flow passage for receiving the processing fluid from outside the chamber and introducing the processing fluid into the processing space and the introduction flow passage is open to the processing space on a side further backward than the substrate in the processing space when viewed from the aperture, a ceiling surface of the processing space and an upper surface of the substrate holder are facing each other in parallel across a gap on a side closer to the aperture than the substrate in the processing space, thereby forming an upper flow passage having a constant flow passage cross-sectional shape, the processing fluid having passed above the substrate flowing in the upper flow passage, the upper flow passage is formed by being surrounded by the lid part, the chamber and the sealing member and connected to a buffer space having a larger flow passage cross-sectional area than the upper flow passage, and a discharge flow passage for discharging the processing fluid to the outside of the chamber is connected to the buffer space.

In the invention thus configured, the substrate can be taken in and out of the processing space through the aperture provided in the side surface of the chamber. The aperture is closed by the lid part coming into contact with the side surface of the chamber via the sealing member, whereby the processing space enters an airtight state. The processing fluid is introduced from the introduction flow passage open to the processing space on a side opposite to the aperture when viewed from the substrate, passes above the substrate and is finally discharged to the outside of the chamber from the aperture side.

More specifically, the processing fluid supplied to a back part of the processing space and having passed above the substrate flows through the upper flow passage formed in the gap between the ceiling surface of the processing space and the upper surface of the substrate holder, flows from the upper flow passage and is discharged from the discharge flow passage via the buffer space. That is, the processing fluid flows in one direction from a back side of the processing space to the aperture side.

The upper flow passage has a constant cross-sectional shape and the processing fluid flows as a laminar flow in the upper flow passage. On the other hand, the buffer space has a larger flow passage cross-sectional area than the upper flow passage. Thus, the processing fluid flowing in the upper flow passage is released at once into the wide buffer space, whereby the pressure of the processing fluid decreases. A backflow of the processing fluid from the buffer space to the upper flow passage is prevented due to this pressure difference and the magnitude of a flow passage resistance of the upper flow passage viewed from the buffer space. The processing fluid released into the buffer space is discharged to the outside via the discharge flow passage.

The buffer space is a space surrounded by the chamber, the lid part and the sealing member. That is, the sealing member is provided to partially face the buffer space. Thus, impurities derived from the sealing member may be mixed into the processing fluid in the buffer space. However, since the backflow from the buffer space to the upper flow passage is prevented as described above, the adhesion of the impurities to the substrate in the processing space is avoided.

As described above, in the invention, the processing fluid flows in one direction from the back side of the processing space toward the aperture side and is discharged from the upper flow passage to the outside of the chamber via the buffer space on a side downstream of the substrate. Thus, the backflow from the buffer space to the upper flow passage is prevented and, even if impurities are mixed into the processing fluid from the sealing member provided to face the buffer space, it is avoided that the impurities adhere to the substrate to contaminate the substrate.

All of a plurality of constituent elements of each aspect of the invention described above are not essential and some of the plurality of constituent elements can be appropriately changed, deleted, replaced by other new constituent elements or have limited contents partially deleted in order to solve some or all of the aforementioned problems or to achieve some or all of effects described in this specification. Further, some or all of technical features included in one aspect of the invention described above can be combined with some or all of technical features included in another aspect of the invention described above to obtain one independent form of the invention in order to solve some or all of the aforementioned problems or to achieve some or all of the effects described in this specification.

BRIEF DESCRIPTION OF THE DRAWINGS

FIGS. 6A and 6B are views schematically showing a relationship of the positions of the discharge flow passages and the flow of the processing fluid.

DETAILED DESCRIPTION OF THE PREFERRED EMBODIMENTS

Figure 1:
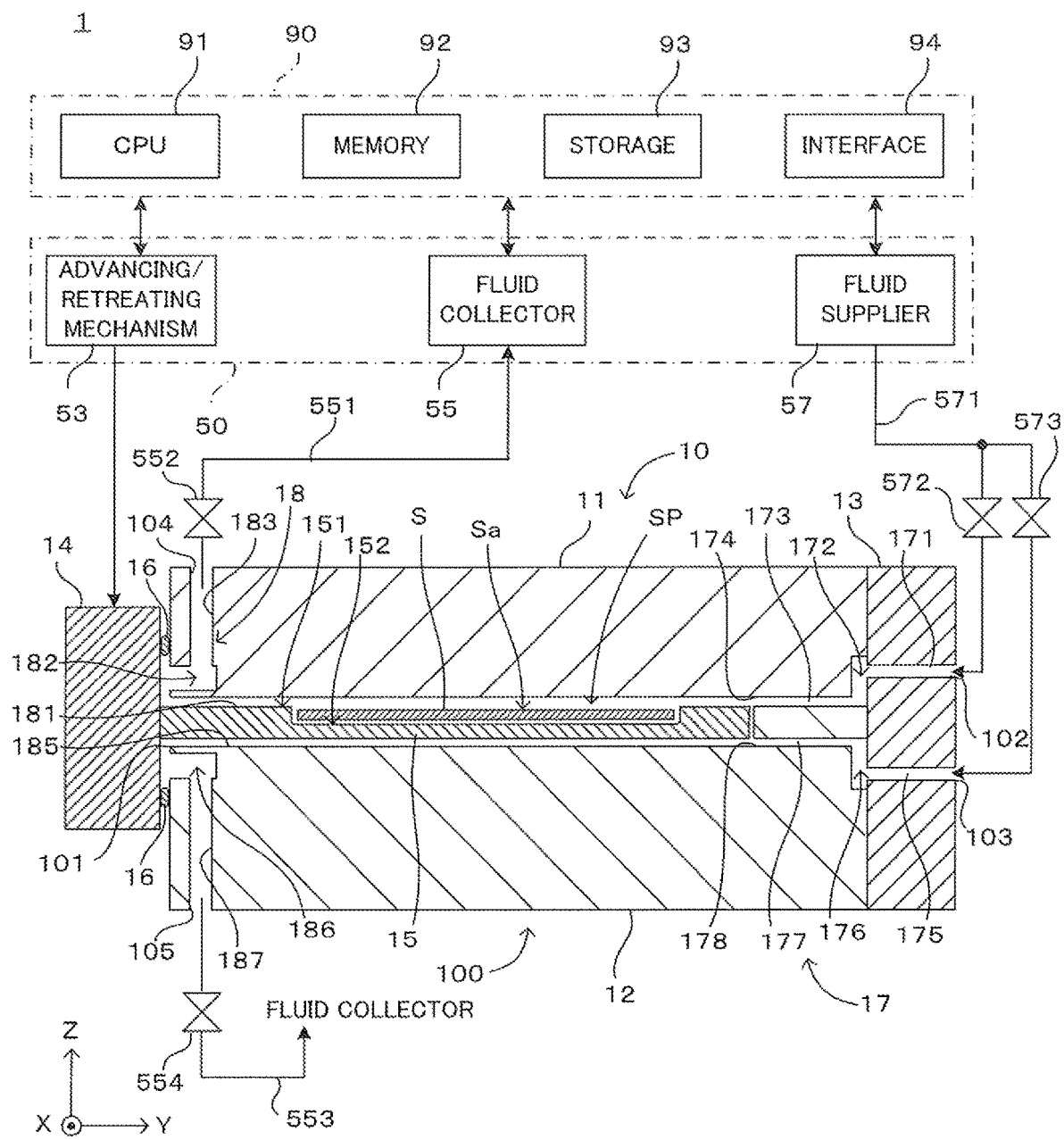
FIG. 1 is a view showing a schematic configuration of one embodiment of a substrate processing apparatus according to the invention.

FIG. 1 is a view showing a schematic configuration of one embodiment of a substrate processing apparatus according to the invention. This substrate processing apparatus 1 is an apparatus for processing surfaces of various substrates such as semiconductor substrates using supercritical fluids. To show directions in each figure in a unified manner below, an XYZ orthogonal coordinate system is set as shown in FIG. 1. Here, an XY plane represents a horizontal plane and a Z direction represents a vertical direction. More specifically, a (−Z) direction represents a vertically downward direction.

Here, various substrates such as semiconductor wafers, glass substrates for photomask, glass substrates for liquid crystal display, glass substrates for plasma display, substrates for FED (Field Emission Display), substrates for optical disk, substrates for magnetic disk, substrates for magneto-optical disk can be adopted as the "substrate" in this embodiment. A substrate processing apparatus used to process a semiconductor wafer is mainly described as an example with reference to the drawings, but the substrate processing apparatus can be adopted also to process various substrates illustrated above.

The substrate processing apparatus 1 includes a processing unit 10, a supply unit 50 and a control unit 90. The processing unit 10 serves as an execution subject of a supercritical drying process, and the supply unit 50 supplies chemical substances and power necessary for the process to the processing unit 10.

The control unit 90 realizes a predetermined process by controlling these components of the apparatus. For this purpose, the control unit 90 includes a CPU 91 for executing various control programs, a memory 92 for temporarily storing processing data, a storage 93 for storing the control programs to be executed by the CPU 91, an interface 94 for information exchange with a user and an external apparatus, and the like. Operations of the apparatus to be described later are realized by the CPU 91 causing each component of the apparatus to perform a predetermined operation by executing the control program written in the storage 93 in advance.

The processing unit 10 includes a processing chamber 100. The processing chamber 100 includes a first member 11, a second member 12 and a third member 13 each formed by a metal block. The first and second members 11, 12 are vertically joined by an unillustrated joining member, and the third member 13 is joined to (+Y) side surfaces of the first and second members 11, 12 by an unillustrated joining member, whereby the processing chamber 100 structured to be hollow inside is configured. This hollow internal space serves as a processing space SP in which the substrate S is processed. A substrate S to be processed is carried into the processing space SP to be processed. A slit-like aperture 101 elongated in an X direction is formed in a (−Y) side surface of the processing chamber 100, and the processing space SP communicates with an outside space via the aperture 101.

A lid part 14 is provided on the (−Y) side surface of the processing chamber 100 to close the aperture 101. A support tray 15 in the form of a flat plate is attached in a horizontal posture to a (+Y) side surface of the lid part 14, and the upper surface of the support tray 15 serves as a support surface on which the substrate S can be placed. More specifically, the support tray 15 is structured such that a recess 152 formed to be slightly larger than a planar size of the substrate S is provided in a substantially flat upper surface 151. The substrate S is accommodated into this recess 152, thereby being held at a predetermined position on the support tray 15. The substrate S is held with a surface Sa to be processed (hereinafter, may be simply referred to as a "substrate surface") faced up. At this time, the upper surface 151 of the support tray 15 and the substrate surface Sa are preferably coplanar.

The lid part 14 is supported horizontally movably in a Y direction by an unillustrated support mechanism. The lid part 14 is movable toward and away from the processing chamber 100 by an advancing/retreating mechanism 53 provided in the supply unit 50. Specifically, the advancing/retreating mechanism 53 includes a linear mechanism such as a linear motor, a linear guide, a ball-screw mechanism, a solenoid or an air cylinder, and such a linear mechanism moves the lid part 14 in the Y direction. The advancing/retreating mechanism 53 operates in response to a control command from the control unit 90.

If the support tray 15 is pulled out from the processing space SP to outside via the aperture 101 by a movement of the lid part 14 in a (−Y) direction, the support tray 15 is accessible from outside. Specifically, it becomes possible to place the substrate S on the support tray 15 and take out the substrate S placed on the support tray 15. On the other hand, the lid part 14 moves in a (+Y) direction, whereby the support tray 15 is accommodated into the processing space SP. If the substrate S is placed on the support tray 15, the substrate S is carried into the processing space SP together with the support tray 15.

In the supercritical drying process mainly aimed to dry a substrate while preventing pattern collapse due to a surface tension of a liquid, the substrate S is carried in with the surface Sa covered by a liquid film to prevent the occurrence of pattern collapse due to the exposed surface Sa. An organic solvent having a relatively low surface tension such as isopropyl alcohol (IPA) or acetone can be preferably used as a liquid constituting the liquid film.

The lid part 14 moves in the (+Y) direction to close the aperture 101, whereby the processing space SP is sealed. A sealing member 16 is provided between the (+Y) side surface of the lid part 14 and the (−Y) side surface of the processing chamber 100 to maintain an airtight state of the processing space SP. An annular member made of an elastic resin material such as rubber can be used as the sealing member 16. Further, the lid part 14 is fixed to the processing chamber 100 by an unillustrated lock mechanism. The substrate S is processed in the processing space SP with the airtight state of the processing space SP ensured in this way.

In this embodiment, a fluid of a substance usable for a supercritical process, e.g. carbon dioxide, is supplied in a gaseous or liquid state to the processing unit 10 from a fluid supplier 57 provided in the supply unit 50. Carbon dioxide enters a supercritical state at relatively low temperature and low pressure and is a chemical substance suitable for the supercritical drying process in having a property of dissolving an organic solvent often used in substrate processing well.

More specifically, the fluid supplier 57 outputs a fluid in a supercritical state or a fluid, which enters the supercritical state retroactively by being supplied in a gaseous or liquid state and having predetermined temperature and pressure applied thereto, as the processing fluid for processing the substrate S. For example, carbon dioxide in the gaseous or liquid state is output in a pressurized state. The fluid is fed under pressure to input ports 102, 103 provided in the (+Y) side surface of the processing chamber 100 via a piping 571 and valves 572, 573 disposed at intermediate positions of the piping 571. That is, the fluid is fed from the fluid supplier 57 to the processing chamber 100 by opening the valves 572, 573 in response to a control command from the control unit 90.

Figure 2A:
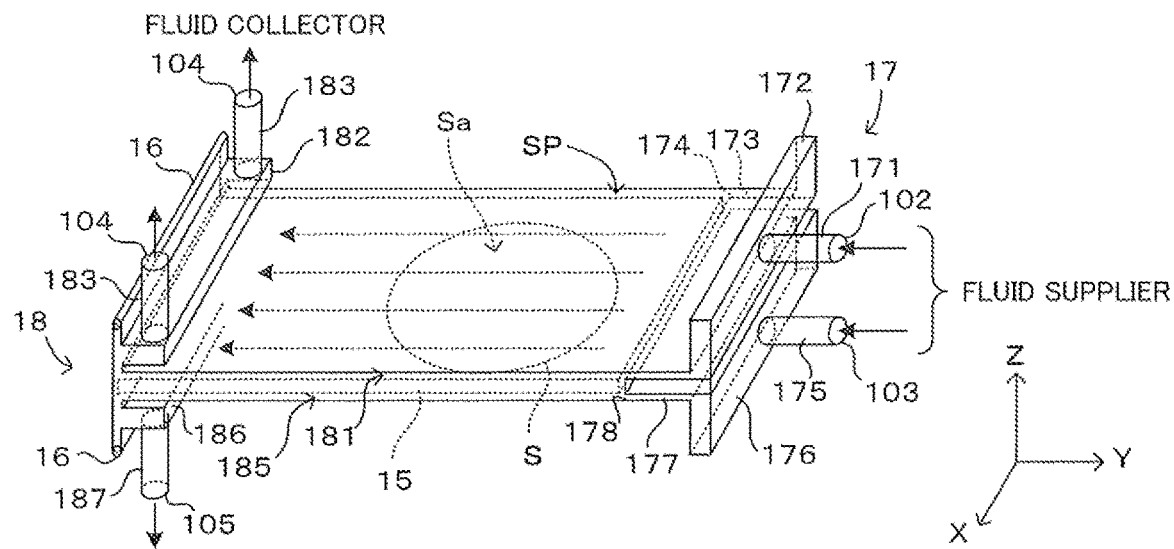
FIGS. 2A to 2C are views schematically showing flow passages of the processing fluid.
Figure 2B:
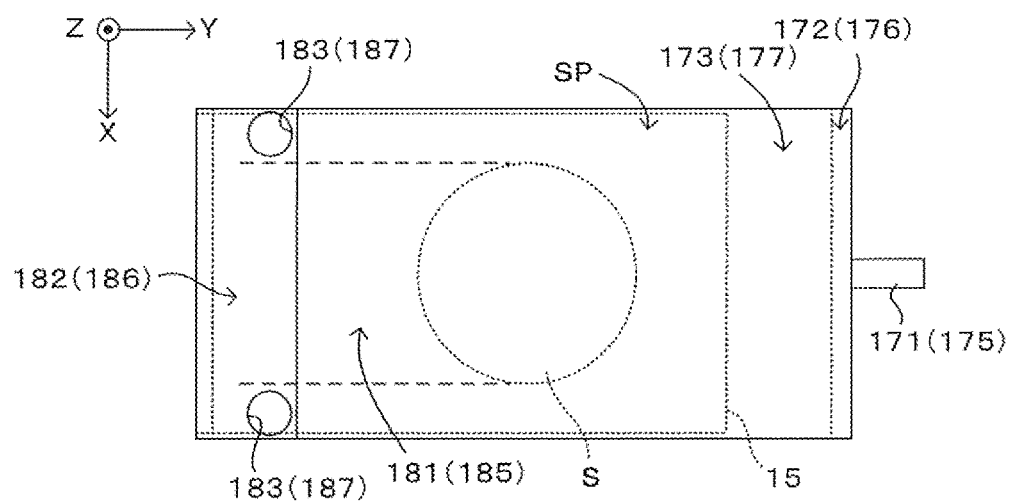
Figure 2C:
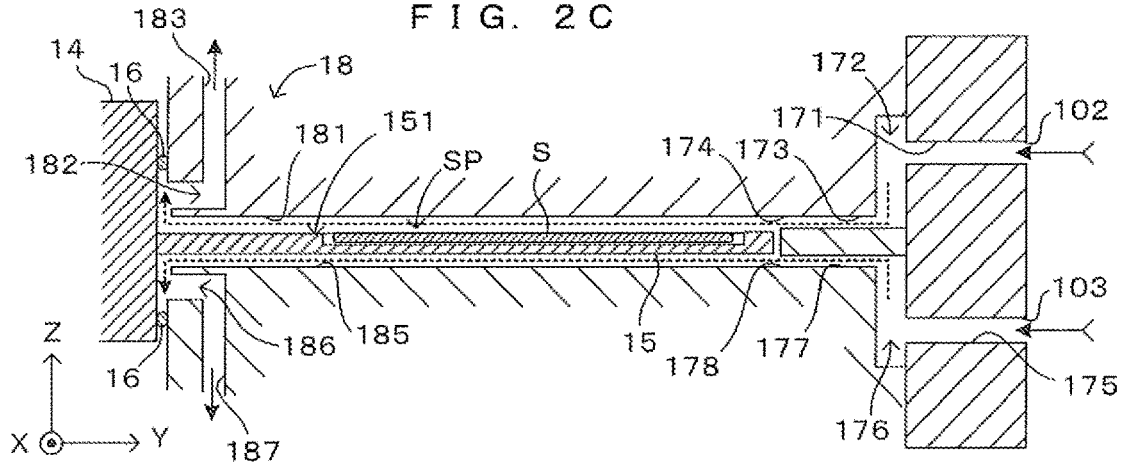

FIGS. 2A to 2C are views schematically showing flow passages of the processing fluid. More specifically, FIG. 2A is a schematic view showing the contours of the flow passages, FIG. 2B is a plan view of the flow passages, and FIG. 2C is a side sectional view of the flow passages. The structures of the flow passages of the processing fluid are described below with reference to FIGS. 1 and 2A to 2C.

A flow passage 17 extending from the input ports 102, 103 to the processing space SP functions as an introduction flow passage for introducing the processing fluid supplied from the fluid supplier 57 to the processing space SP. Specifically, a flow passage 171 is connected to the input port 102. A buffer space 172 formed to suddenly enlarge a flow passage cross-sectional area is provided on an end part of the flow passage 171 opposite to the input port 102.

A flow passage 173 is further provided to connect the buffer space 172 and the processing space SP. The flow passage 173 has such a wide cross-sectional shape narrow in a vertical direction (Z direction) and long in a horizontal direction (X direction), and that cross-sectional shape is substantially constant in a flowing direction of the processing fluid. An end part of the flow passage 173 opposite to the buffer space 172 serves as a discharge opening 174 open to the processing space SP, and the processing fluid is introduced into the processing space SP through this discharge opening 174.

Desirably, a height of the flow passage 173 is equal to a distance between the ceiling surface of the processing space SP and the substrate surface Sa with the support tray 15 accommodated in the processing space SP. The discharge opening 174 is open to a gap between the ceiling surface of the processing space SP and the upper surface 151 of the support tray 15. For example, the ceiling surface of the flow passage 173 and the ceiling surface of the processing space SP can be coplanar. As just described, the discharge opening 174 is in the form of a slit elongated in the horizontal direction and facing the processing space SP.

Flow passages of the processing fluid are also similarly formed below the support tray 15. Specifically, a flow passage 175 is connected to the input port 103. A buffer space 176 formed to suddenly enlarge a flow passage cross-sectional area is provided on an end part of the flow passage 175 opposite to the input port 103.

The buffer space 176 and the processing space SP communicate via a flow passage 177. The flow passage 177 has such a wide cross-sectional shape narrow in the vertical direction (Z direction) and long in the horizontal direction (X direction), and that cross-sectional shape is substantially constant in the flowing direction of the processing fluid. An end part of the flow passage 177 opposite to the buffer space 176 serves as a discharge opening 178 open to the processing space SP, and the processing fluid is introduced into the processing space SP through this discharge opening 178.

Desirably, a height of the flow passage 177 is equal to a distance between the bottom surface of the processing space SP and the lower surface of the substrate S. The discharge opening 178 is open to a gap between the bottom surface of the processing space SP and the lower surface of the support tray 15. For example, the bottom surface of the flow passage 177 and the bottom surface of the processing space SP can be coplanar. That is, the discharge opening 178 is in the form of a slit elongated in the horizontal direction and facing the processing space SP.

In the Z direction, the flow passages 171 and 173 are desirably arranged at different positions. If the both flow passages are at the same height, part of the processing fluid having entered the buffer space 172 from the flow passage 171 directly flows straight to enter the flow passage 173. Then, a flow rate and a flow velocity of the processing fluid flowing into the flow passage 173 may be different at a position corresponding to the flow passage 171 and at other positions in a width direction of the flow passage orthogonal to the flowing direction, i.e. in the X direction. This makes the flow of the processing fluid flowing into the processing space SP from the flow passage 173 nonuniform in the X direction and causes a turbulence.

By arranging the flow passages 171, 173 at positions different in the Z direction, the processing fluid does not flow straight from the flow passage 171 to the flow passage 173 and the processing fluid can be introduced as a laminar flow uniform in the width direction into the processing space SP.

The processing fluid introduced from the introduction flow passage 17 is configured as just described flows along the upper and lower surfaces of the support tray 15 in the processing space SP and is discharged to the outside of the chamber via a flow passage 18 configured as described below. The ceiling surface of the processing space SP and the upper surface 151 of the support tray 15 are both horizontal surfaces on a side closer to a (−Y) side than the substrate S, and the both surfaces are facing each other in parallel while keeping a constant gap. This gap functions as an upper flow passage 181 for introducing the processing fluid flowing along the upper surface 151 of the support tray 15 and the surface Sa of the substrate S into a discharge flow passage to be described later. That is, the upper flow passage 181 has such a wide cross-sectional shape narrow in the vertical direction (Z direction) and long in the horizontal direction (X direction).

An end part of the upper flow passage 181 opposite to the processing space SP is connected to a buffer space 182. A more detailed structure is described later. The buffer space 182 is a space surrounded by the chamber 100, the lid part 14 and the sealing member 16. A width of the buffer space 182 is equal to or larger than that of the upper flow passage 181 in the X direction, and a height of the buffer space 182 is larger than that of the upper flow passage 181 in the Z direction. Thus, the buffer space 182 has a larger flow passage cross-sectional area than the upper flow passage 181.

Discharge flow passages 183 are connected to an upper part of the buffer space 182. The discharge flow passages 183 are through holes provided through the first member 11, which is an upper block constituting the chamber 100. The upper ends of the discharge flow passages 183 constitute output ports 102 open in the upper surface of the chamber 100, and the lower ends thereof are open to the buffer space 182.

Similarly, the bottom surface of the processing space SP and the lower surface of the support tray 15 are both horizontal surfaces, and the both surfaces are facing each other in parallel while keeping a constant gap. This gap functions as a lower flow passage 185 for introducing the processing fluid flowing along the lower surface of the support tray 15 into the discharge flow passages. That is, the lower flow passage 185 has such a wide cross-sectional shape narrow in the vertical direction (Z direction) and long in the horizontal direction (X direction).

An end part of the lower flow passage 185 opposite to the processing space SP is connected to a buffer space 186. Similarly to the buffer space 182, the buffer space 186 is a space surrounded by the chamber 100, the lid part 14 and the sealing member 16. A width of the buffer space 186 is equal to or larger than that of the lower flow passage 185 in the X direction, and a height of the buffer space 186 is larger than that of the lower flow passage 185 in the Z direction. Thus, the buffer space 186 has a larger flow passage cross-sectional area than the lower flow passage 185.

Discharge flow passages 187 are connected to a lower part of the buffer space 186. The discharge flow passages 187 are through holes provided through the second member 12, which is a lower block constituting the chamber 100. The lower ends of the discharge flow passages 187 constitute output ports 105 open in the lower surface of the chamber 100, and the upper ends thereof are open to the buffer space 186.

The processing fluid flowing above the support tray 15 in the processing space SP is fed to the output ports 104 via the upper flow passage 181, the buffer space 182 and the discharge flow passages 183. The output ports 104 are connected to a fluid collector 55 by a piping 551, and a valve 552 is disposed at an intermediate position of the piping 551.

Similarly, the processing fluid flowing below the support tray 15 in the processing space SP is fed to the output ports 105 via the lower flow passage 185, the buffer space 186 and the discharge flow passages 187. The output ports 105 are connected to the fluid collector 55 by a piping 553, and a valve 554 is disposed at an intermediate position of the piping 553.

The valves 552, 554 are controlled by the control unit 90. If the valves 552, 554 are opened in response to a control command from the control unit 90, the processing fluid in the processing space SP is collected into the fluid collector 55 via the pipings 551, 553.

As shown in FIGS. 2A and 2C, the processing fluid fed under pressure from the fluid supplier 57 to the input ports 104 is released into the buffer space 172, which is a relatively large space, by way of the flow passage 171. Even if the fluid is supplied in the form of a liquid, the fluid possibly evaporates and expands in the flow passage due to a variation of pressure loss in the flow passage or the like. If such a sudden expansion occurs near the substrate S, the substrate S may be damaged.

To avoid this, a part where pressure loss largely varies is provided in a part of the flow passage 171 leading to the processing space SP, so that possible evaporation and expansion occur in this part. The buffer space 172 is provided as a space for this. Further, the buffer space 172 also has a function as a manifold for rectification to enable the fluid flowing in the pipe-like flow passage 171 to be supplied in the form of a thin layer to the processing space SP. Functions of the buffer space 176 are also similar.

The processing fluid supplied from the buffer space 172 to the processing space SP through the discharge opening 174 by way of the flow passage 173 having a constant flow passage cross-sectional area passes above the substrate surface Sa as a laminar flow keeping a constant width and a constant thickness as schematically shown by dotted-line arrows in FIG. 2A. Similarly, the processing fluid supplied from the buffer space 176 to the processing space SP through the discharge opening 178 by way of the flow passage 177 having a constant flow passage cross-sectional area flows along the lower surface of the support tray 15 as a laminar flow keeping a constant width and a constant thickness.

The processing fluid having passed around the substrate S flows further to a downstream side by way of the upper flow passage 181 and the lower flow passage 185. Since the flow passages keep substantially the same cross-sectional shapes also here, a laminar flow state is maintained. The processing fluid flowing in the upper and lower flow passages 181, 185 is discharged to the outside of the chamber by way of the discharge flow passages 183, 187 after being released into the buffer spaces 182, 186. In this way, the processing fluid flows in one direction, specifically in the (−Y) direction, in the processing space SP. Thus, the generation of a turbulence of the processing fluid around the substrate S is avoided.

If the processing space SP is viewed from the aperture 101, the processing fluid flows as a substantially uniform and continuous laminar flow from the (+Y) side (back side) toward the (−Y) side (front side) of the substrate S in the processing space SP as schematically shown by dotted-line arrows in FIG. 2C. The clean processing fluid is constantly supplied from the back side of the processing space SP, and the processing fluid having passed around the substrate S flows toward the downstream side, i.e. toward the aperture 101. Therefore, remaining liquid components and the like liberated from the substrate S are pushed to flow in one direction to the aperture 101 together with the processing fluid, whereby these components and the like are prevented from being carried by a turbulence around the substrate S and adhering to the substrate S again.

As shown in FIG. 2A, a pair of the discharge flow passages 183, 183 are provided near both end parts of the buffer space 182 elongated in the X direction. Openings of the discharge flow passages 183, 183 facing the buffer space 182 are desirably provided further outward than both end parts in the X direction of the substrate S accommodated in the processing space SP as shown in FIG. 2B. The reason for that is described in detail later.

Figure 3A:
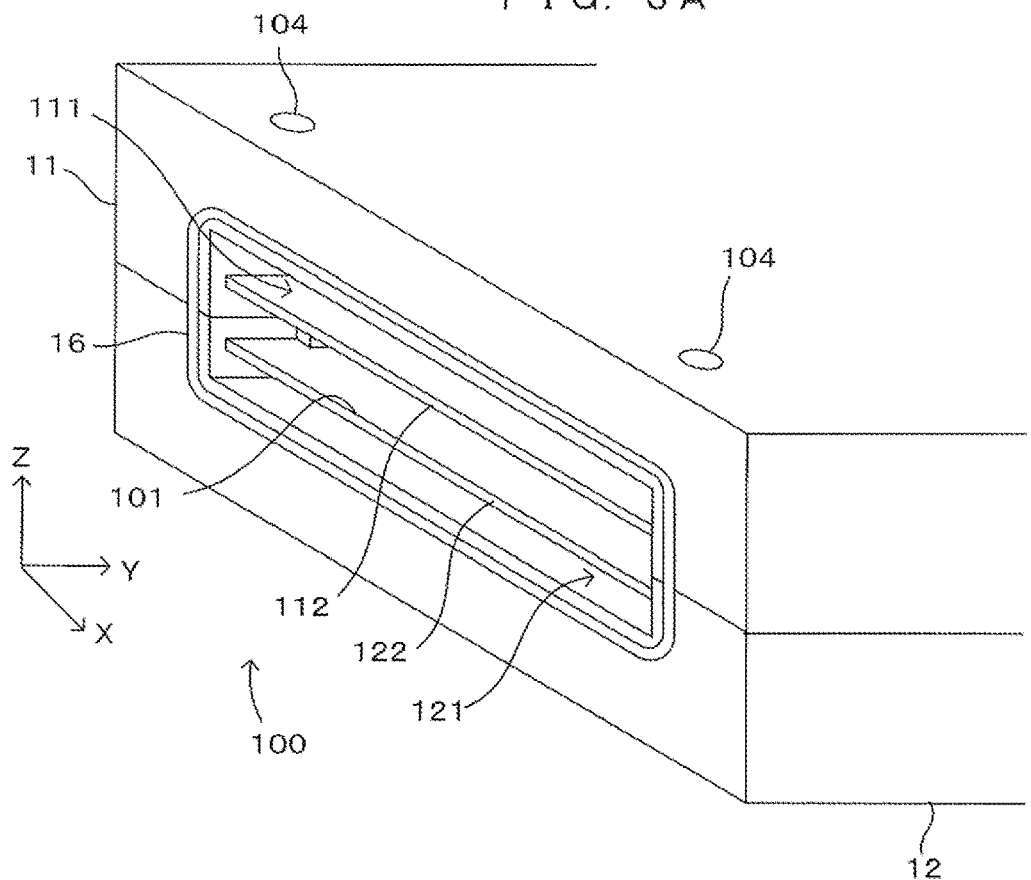
FIGS. 3A and 3B are views illustrating a structure around the aperture of the chamber.
Figure 3B:
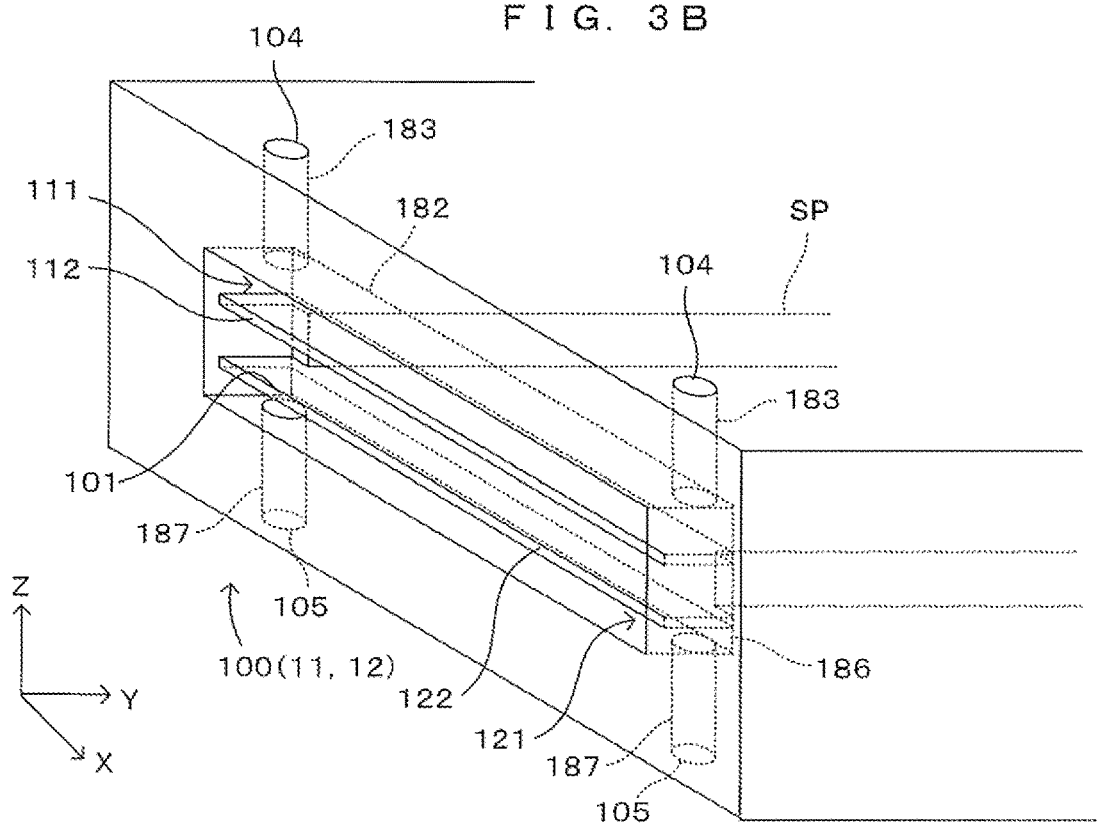

FIGS. 3A and 3B are views illustrating a structure around the aperture of the chamber. More specifically, FIG. 3A is an external view showing the aperture 101 of the chamber 100. Further, FIG. 3B is a view in which a boundary line between the sealing member 16 and the first and second members 11, 12 is omitted from FIG. 3A and a structure hidden in FIG. 3A is shown by hidden lines (dotted lines) instead to show the internal structure of the chamber 100 in an easy-to-see manner.

As shown in these figures, the annular sealing member 16 is attached to the (−Y) side surface of the chamber 100 and the aperture 101 is provided in an internal region surrounded by the sealing member 16. More specifically, the (−Y) side surfaces of the first and second members 11, 12 constituting the chamber 100 are recessed toward the (+Y) side to provide recesses 111, 112. A flange-like separation wall 112 having a width equal to or slightly larger than that of the processing space SP in the X direction and thin in the vertical direction (Z direction) is provided to project in the (−Y) direction on the lower end of the recess 111 of the first member 11. Further, a flange-like separation wall 122 having a width equal to or slightly larger than that of the processing space SP in the X direction and thin in the vertical direction (Z direction) is also provided to project in the (−Y) direction on the upper end of the recess 112 of the second member 12.

Tip parts of the separation walls 112, 122 on the (−Y) side and end surfaces of the recesses 111, 121 on the (−X) and (+X) sides form the aperture 101. The lower surface of the separation wall 112 is coplanar with the ceiling surface of the processing space SP, whereas the upper surface of the separation wall 122 is coplanar with the bottom surface of the processing space SP. That is, a space between the separation walls 112, 122 serves as a (−Y) side end part of the processing space SP communicating with the aperture 101. As just described, the separation wall 112 is a separation wall separating the inside of the recess 111 into the processing space SP and an upper space above and adjacent to the processing space SP, whereas the separation wall 122 is a separation wall separating the inside of the recess 121 into the processing space SP and a lower space below and adjacent to the processing space SP.

The upper space above the separation wall 112 forms the buffer space 182 by having an opening thereof on the (−Y) side closed by the lid part 14. Further, the lower space below the separation wall 122 forms the buffer space 186 by having an opening thereof on the (−Y) side closed by the lid part 14. The discharge flow passages 183, 183 are connected near both end parts in the X direction of the upper surface of the recess 111. The discharge flow passages 183, 183 communicate with the output ports 104, 104 provided in the upper surface of the first member 11. Further, the discharge flow passages 187, 187 are connected near both end parts in the X direction of the lower surface of the recess 121. The discharge flow passages 187, 187 communicate with the output ports 105, 105 provided in the lower surface of the second member 12.

Figure 4:
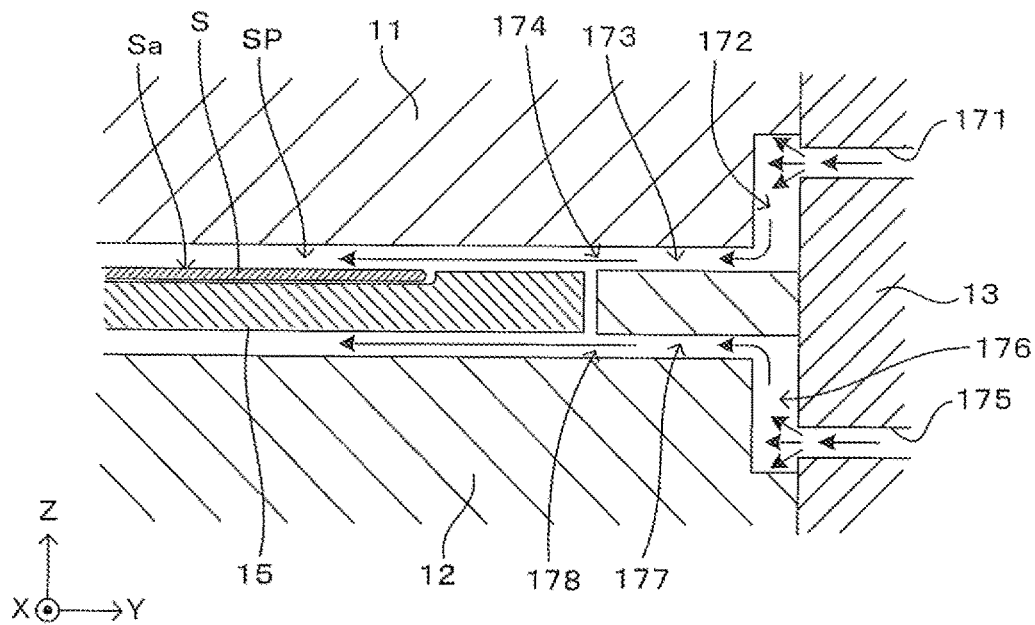
FIG. 4 is a sectional view schematically showing a flow of the processing fluid being introduced into the processing space.

FIG. 4 is a sectional view schematically showing a flow of the processing fluid being introduced into the processing space. The flow of the processing fluid above the substrate S is as follows. Arrows schematically show a direction of the flow of the processing fluid. The processing fluid fed under pressure to the flow passage 171 is introduced into the processing space SP through the discharge opening 174 by way of the flow passage 173 narrow in the vertical direction and wide in the horizontal direction after having the pressure thereof adjusted by being released into a wide space in the buffer space 172.

Since the flow passage 173 and the discharge opening 174 have substantially the same cross-sectional shape as a gap space between the ceiling surface of the processing space SP and the substrate S (support tray 15), the processing fluid flows from the flow passage 173 to the processing space SP while keeping the laminar flow state. Therefore, the processing fluid further flows toward the downstream side, i.e. the (+Y) side as a laminar flow along the substrate surface Sa. Also below the substrate S (support tray 15), the processing fluid fed under pressure to the flow passage 175 is introduced into the processing space SP through the discharge opening 178 by way of the buffer space 176 and the flow passage 177 and flows below the support tray 15 as a laminar flow.

Figure 5:
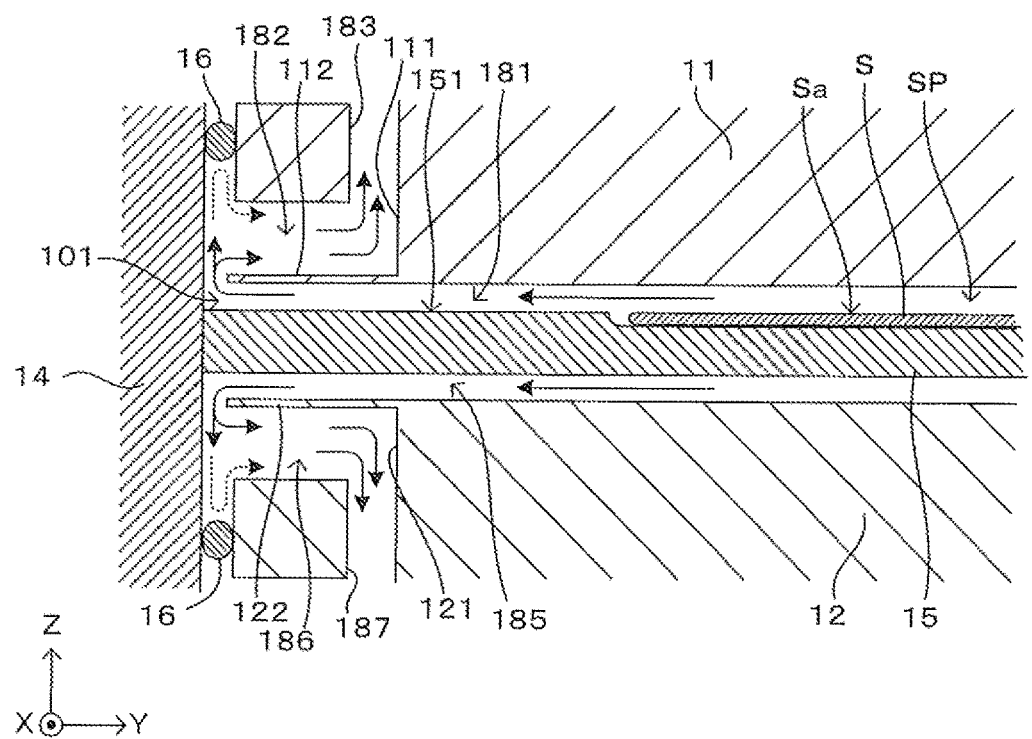
FIG. 5 is a sectional view schematically showing a flow of the processing fluid discharged from the processing space.

FIG. 5 is a sectional view schematically showing a flow of the processing fluid discharged from the processing space. The flow of the processing fluid above the substrate S is as follows. Arrows schematically show a direction of the flow of the processing fluid. In a state where the lid part 14 closes the aperture 101 and the support tray 15 having the substrate S placed thereon is accommodated in the processing space SP, the flowing direction of the processing fluid flowing in the (−Y) direction in the processing space SP is changed to the vertical direction by the lid part 14, and is finally discharged to the outside of the chamber by way of the buffer spaces 182, 186 and the discharge flow passages 183, 187.

The processing fluid flowing along the substrate surface Sa flows in the (−Y) direction in the upper flow passage 181 formed between the ceiling surface of the processing space SP and the support tray 15 while the laminar flow state is maintained. Then, the processing fluid comes into contact with the (+Y) side surface of the lid part 14 to change the flowing direction to an upward direction and flows into the buffer space 182. In the buffer space 182, the processing fluid flows in the (+Y) direction and is discharged to the outside via the discharge flow passages 183 connected to an upper part of the buffer space 182. That is, when the processing fluid flows into the buffer space 182 from the upper flow passage 181, the flowing direction of the processing fluid is reversed. Further, the direction of the flow passage is changed by 90° also between the buffer space 182 and the discharge flow passages 183.

As just described, the processing fluid having passed through the upper flow passage 181 is finally discharged to the outside of the chamber while the flowing direction thereof is changed. When the processing fluid flows into the buffer space 182 having a large flow passage cross-sectional area from the upper flow passage 181 having a small flow passage cross-sectional area, the pressure of the processing fluid is released and the processing fluid vigorously flows into the buffer space 182. Moreover, at this time, the flowing direction is changed and a flow passage resistance of the upper flow passage 181 viewed from the buffer space 182 increases. Thus, a swirl of the processing fluid is possibly generated in the buffer space 182, but the processing fluid does not flow back to the narrow upper flow passage 181 against the flow blowing out at a high pressure. As shown in FIG. 2A, the buffer space 182 is elongated in the X direction. Specifically, the width of the buffer space 182 is equal to or slightly larger than the width of the upper flow passage 181 in the X direction.

As shown in FIG. 5, the buffer space 182 is formed by closing an opening surface of the recess 111 provided in the (−Y) side end surface of the first member 11 constituting an upper part of the chamber 100 by the lid part 14. The buffer space 182 is a space surrounded by the first member 11, the lid part 14 and the sealing member 16, and the sealing member 16 is interposed in a clearance between the first member 11 and the lid part 14. Thus, the sealing member 16 is partially exposed to the buffer space 182, and the processing fluid filling up the buffer space 182 unavoidably contacts the sealing member 16. If the sealing member 16 is made of rubber, organic components may be dissolved and mixed as impurities into the processing fluid.

In the buffer space 182, such a flow is possibly generated in which part of the processing fluid flows into the clearance between the lid part 14 and the first member 11, contacts the sealing member 16 and returns to the buffer space 182 as shown by a dotted-line arrow. Since the flowing direction of the processing fluid is changed to the upward direction when the processing fluid flows into the buffer space 182 from the upper flow passage 181, such a flow as to rather actively feed the processing fluid toward the sealing member 16 is easily generated.

Accordingly, the impurities mixed from the sealing member 16 are separated from the sealing member 16 while being mixed into the processing fluid in the buffer space 182, and are discharged from the buffer space 182 together with the processing fluid. As just described, since the processing fluid including the impurities is less likely to be retained around the sealing member 16, a gradual increase of an impurity concentration is avoided. Further, the processing fluid in the buffer space 182 is discharged to the outside without flowing back to the upper flow passage 181. From these, it is effectively prevented that the impurities liberated from the sealing member 16 adhere to the substrate S in the processing space SP to contaminate the substrate S.

To effectively prevent a backflow of the processing fluid from the buffer space 182 to the upper flow passage 181, it is effective to suddenly change the flow passage cross-sectional area in a connecting part of the upper flow passage 181 and the buffer space 182. That is, the cross-sectional area and shape of the flow passage of the processing fluid are preferably as constant as possible until the processing fluid reaches the buffer space 182. To realize this, a gap between the separation walls 112, 122 and the lid part 14 with the aperture 101 closed by the lid part 14, i.e. a distance between the (−Y) side tip parts of the separation walls 112, 122 and the (+Y) side principal surface of the lid part 14, is desirably equal to the height of the upper flow passage 181, i.e. a distance between the ceiling surface of the processing space SP and the upper surface 151 of the support tray 15.

The same holds for the processing fluid flowing below the support tray 15. The processing fluid is released into the buffer space 186 from the lower flow passage 185 formed between the lower surface of the support tray 15 and the bottom surface of the processing space SP, whereby a backflow of the processing fluid to the lower flow passage 185 is prevented. The impurities liberated from the sealing member 16 and mixed into the buffer space 186 are discharged to the outside from the discharge flow passages 187 together with the processing fluid. From these, it is prevented that the impurities generated from the sealing member 16 enter the processing space SP to contaminate the substrate S.

The impurities to be mixed into the processing fluid possibly include impurities flying from outside when the substrate S is carried in and adhering to the aperture 101, the lid part 14 and the like, besides those generated from the sealing member 16. This embodiment is also effective for such a problem of contaminating the substrate S by impurities. This is for the following reason. Since the processing fluid is supplied from the side further backward than the substrate S when viewed from the aperture 101 and the processing fluid is restricted to flow in one direction toward the front side in the processing space SP, even if impurities are mixed into the processing fluid around the aperture 101, it is prevented that those impurities flow back to the processing space SP and adhere to the substrate S.

As shown in FIGS. 2A and 3B, the discharge flow passages 183 (187) for discharging the processing fluid from the buffer space 182 (186) are connected to the both end parts in the X direction of the buffer space 182 (186). The reason for this is described with reference to FIGS. 6A and 6B.

Figure 6A:
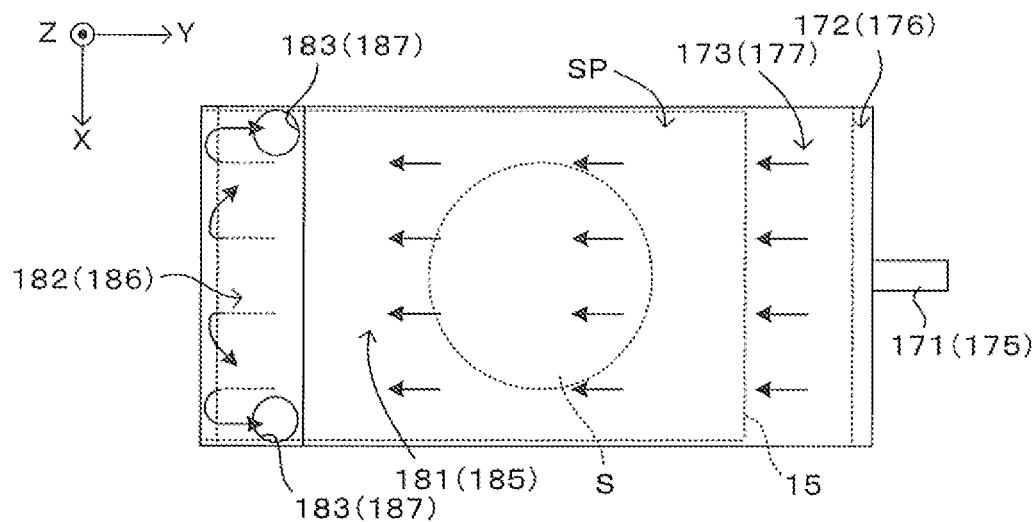
Figure 6A:
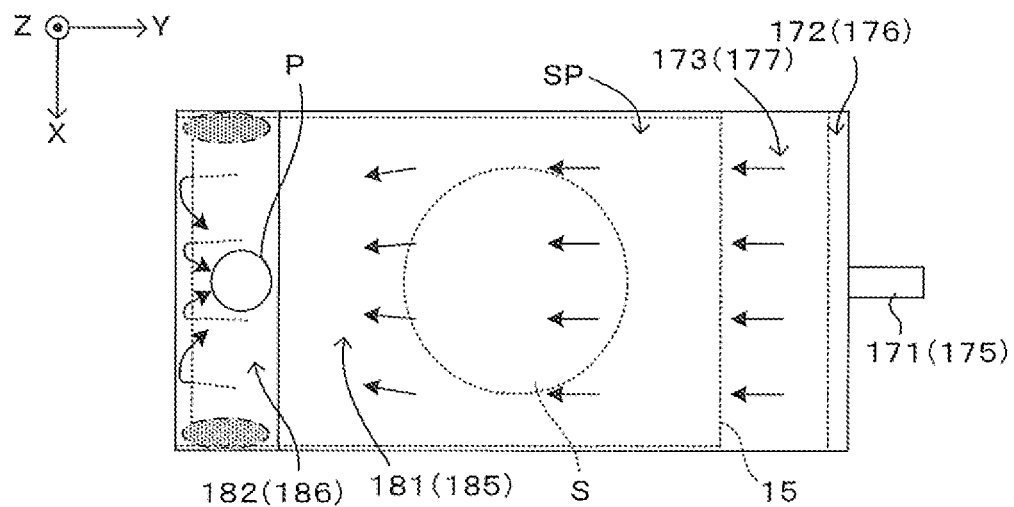

FIGS. 6A and 6B are views schematically showing a relationship of the positions of the discharge flow passages and the flow of the processing fluid. The inventors of this application acquired the following knowledge by conducting a simulation experiment of analyzing the flow of the processing fluid by variously differentiating the connected positions of the discharge flow passages 183 (187) to the buffer space 182 (186). Note that, in terms of forming a uniform laminar flow in the processing space SP, it is premised that the arrangement of the discharge flow passages is symmetric in the X direction (i.e. with respect to a YZ plane).

As shown by arrows in FIG. 6A, the processing fluid flows as a uniform laminar flow in the (−Y) direction in the processing space SP and flows into the discharge flow passages 183 (187) by way of the buffer space 182 (186) from the flow passage 181 (185). When the discharge flow passages 183 (187) are connected to the both end parts in the X direction of the buffer space 182 (186), the flow of the processing fluid in the buffer space 182 (186) is dispersed on both sides in the X direction. Thus, the processing fluid maintains a substantially uniform flow in the X direction at least until flowing into the buffer space 182 (186) from the flow passage 181 (185).

On the other hand, if a discharge flow passage is arranged on a more central side, for example, like a discharge flow passage P shown in FIG. 6B as a comparative example, the flow of the processing fluid toward the discharge flow passage P by way of the buffer space 182 (186) concentrates in a central part. Due to this, the flow of the processing fluid toward the central side is also generated in the flow passage 181 (185). This possibly causes a turbulence in the processing space SP.

Further, due to the concentration of the processing fluid in a central direction, the processing fluid is retained near the both end parts in the X direction of the buffer space 182 (186) shown by shading in FIG. 6B. As described above, the processing fluid in the buffer space 182 (186) possibly includes impurities liberated from the substrate S and/or the sealing member 16. The retention of the processing fluid including such impurities and a disturbance of the laminar flow in the processing space SP cause an increased risk that the impurities adhere to the substrate S to contaminate the substrate S. Even if the discharge flow passages P are arranged at a plurality of positions to disperse the flow, a similar risk remains in disturbing the laminar flow if the discharge flow passages P are arranged to form such a flow of the processing fluid toward the central side.

Such a problem is solved by arranging the discharge flow passages 183 (187) near the both end parts of the buffer space 182 (186). It is particularly effective that the discharge flow passages 183 (187) are open on sides further outward in the X direction than the end part in the X direction of the substrate S in the processing space SP as shown in FIG. 2B. By doing so, a turbulence of the processing fluid flowing along the substrate S is avoided, and the adhesion of the impurities carried by the turbulence can also be effectively prevented.

Note that it has been thus far described that the separation wall 112 (122) separating the processing space SP and the buffer space 182 (184) is integrally formed to the first member 11 (second member 12) constituting the processing chamber 100. More realistically, the separation walls can be provided to have the following structure.

Figure 7A:
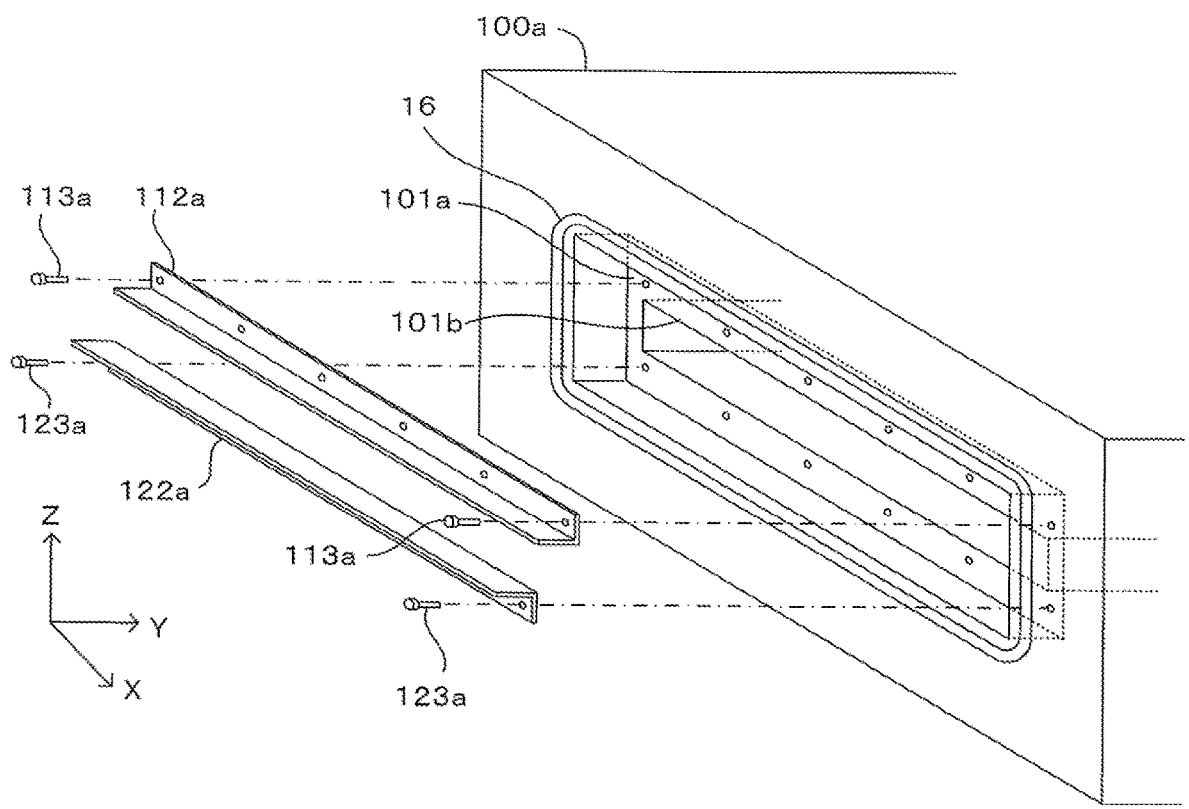
FIGS. 7A and 7B are views illustrating another structure around the aperture of the processing chamber.
Figure 7B:
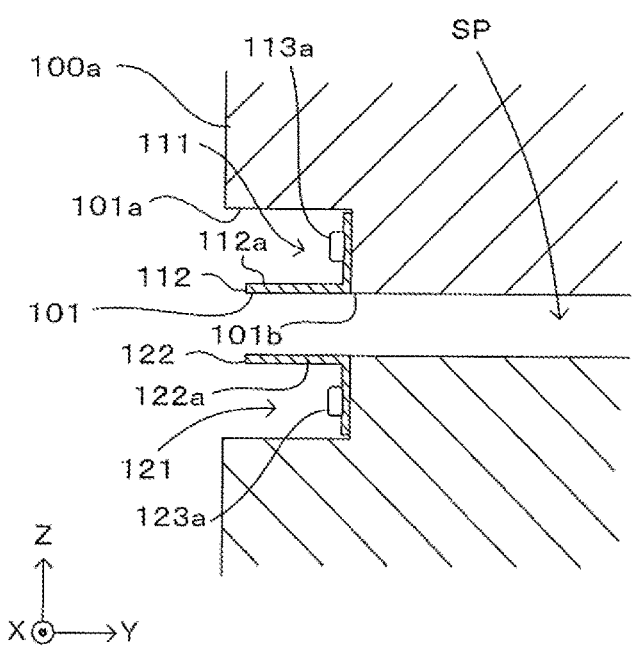

FIGS. 7A and 7B are views illustrating another structure around the aperture of the processing chamber. More specifically, FIG. 7A is an exploded view showing the periphery of an aperture of a processing chamber 100a of this example, and FIG. 7B is a view showing a cross-sectional structure around the aperture. Note that, in FIGS. 7A and 7B and the description thereof, structural elements having functions substantially similar to those shown in FIG. 3A are denoted by the same reference signs and are not described in detail.

In this processing chamber 100a, a (−Y) side surface is recessed toward the (+Y) side to form a recess 101a. An opening 101b communicating the processing space SP is provided in a central part of the recess 101a. A separation wall forming member 112a, which is an angled member formed separately from the chamber 100a and having a substantially L-shaped cross-section is fixed to an upper part of the opening 101b by fixing screws 13a. Similarly, a separation wall forming member 122a is fixed to a lower part of the opening 101b by fixing screws 123a.

Also by such a structure, a structure in which the aperture 101 communicating with the processing space SP and the recesses 111, 121 provided above and below the aperture 101 are separated by the separation walls 112, 122 can be realized as shown in FIG. 7B.

As described above, in this embodiment, the processing chamber 100 mainly composed of the first to third members 11 to 13 functions as a "chamber" of the invention. Further, the support tray 15 functions as a "substrate holder" of the invention, and the aperture 101 corresponds to an "aperture" of the invention.

Further, the flow passage 17 corresponds to an "introduction flow passage" of the invention, and the upper flow passage 181, the buffer space 182 and the discharge flow passages 183 function as "an upper flow passage", a "buffer space" and a "discharge flow passage" of the invention. On the other hand, the lower flow passage 185, the buffer space 186 and the discharge flow passages 187 function as a "lower flow passage", a "lower buffer space" and a "lower discharge flow passage" of the invention.

Note that the invention is not limited to the embodiment described above and various changes other than the aforementioned ones can be made without departing from the gist of the invention. For example, in the substrate processing apparatus 1 of the above embodiment, the flow passage (introduction flow passage) 17 for introducing the processing fluid into the processing space SP is divided into the flow passage for supplying the processing fluid to the upper surface side of the support tray 15 and the flow passage for supplying the processing fluid to the lower surface side of the support tray 15. However, the aforementioned flow passage configuration on the discharge side and functions achieved thereby are established independently of the flow passage configuration on the supply side. That is, the configuration of the introduction flow passage is not limited to the above one.

Further, in the above embodiment, the buffer spaces 182, 186 are formed by the lid part 14 closing the recesses 111, 121 provided in the side surface of the processing chamber 100 (via the sealing member 16). However, these recesses may be provided in the lid part 14.

Further, in the above embodiment, the discharge flow passages of the processing fluid having passed through the upper surface side of the support tray 15 and those of the processing fluid having passed through the lower surface side have the same structure. However, for the purpose of preventing the adhesion of the impurities to the substrate S by a backflow of the processing fluid, a backflow preventing structure may be employed at least on the upper surface side of the support tray 15 where the processing fluid contacts the substrate S. Therefore, the processing fluid passing through the lower surface side of the support tray 15 can also be discharged from a path having a different structure from the above.

Further, various chemical substances used in the process of the above embodiment are some of examples and various other ones can be used instead of these if those conform to the technical concept of the invention described above.

As the specific embodiment has been illustrated and described above, the substrate processing apparatus according to the invention may be so configured that the flowing direction of the processing fluid is changed by 90° or more in the connecting part of the upper flow passage and the buffer space. According to such a configuration, a flow passage resistance of the upper flow passage when viewed from the buffer space increases, wherefore a backflow preventing effect is more improved.

For example, the recess retracted further than the opening surface of the aperture may be formed above the aperture in the side surface of the chamber provided with the aperture and the sealing member and the lid part arranged above the recess may close the recess to form the buffer space. According to such a configuration, the processing fluid flowing through the upper flow passage is discharged to the outside after contacting around the aperture and the lid part for closing the aperture. Therefore, also impurities intruding from the outside and adhering to the periphery of the aperture can also be discharged to the outside without being flowed back to the upper flow passage.

In this case, for example, a width of the recess may be equal to or larger than an opening width of the aperture in the horizontal direction. According to this configuration, since a width of the buffer space formed by closing the recess is equal to or larger than the width of the upper flow passage, the backflow preventing effect can be further enhanced by increasing the flow passage resistance of the upper flow passage viewed from the buffer space.

Further, the processing space and the recess may be separated by the separation wall in the form of a horizontal flat plate. According to this configuration, a clearance between the separation wall and the substrate holder functions as the upper flow passage, whereas a space surrounded by the recess and the separation wall functions as the buffer space. In this way, the connection of the upper flow passage to the buffer space can be realized by a relatively simple structure.

In this case, the size of the clearance between the tip of the separation wall and the lid part may be equal to the size of the gap between the ceiling surface of the processing space and the upper surface of the substrate holder. According to such a configuration, the cross-sectional area of the flow passage from the upper flow passage to the clearance between the tip of the separation wall and the lid part becomes substantially constant and the flow passage up to the tip of the separation wall can be regarded substantially as the upper flow passage. By increasing a change of the flow passage cross-sectional area in the connecting part of the upper flow passage to the buffer space, a difference in flow passage resistance between the upper flow passage and the buffer space can be made prominent.

For example, the lower surface of the substrate holder and the bottom surface of the processing space may be facing each other in parallel across a gap to form the low flow passage which has a constant flow passage cross-sectional shape and in which the processing fluid having passed below the substrate flows, the lower flow passage may be connected to the lower buffer space formed by being surrounded by the lid part, the chamber and the sealing member and having a larger flow passage cross-sectional area than the lower flow passage, and the lower discharge flow passage for discharging the processing fluid to the outside of the chamber may be connected to the lower buffer space. According to such a configuration, the backflow preventing effect is also achieved for the processing fluid passing below the substrate holder.

Further, in the invention, the processing fluid may be a supercritical fluid. The processing fluid in a supercritical state has a much lower surface tension than various liquids and, for example, even if a substrate is formed with a fine pattern, has an ability to efficiently replace and remove a liquid or the like remaining in the pattern. Further, by evaporation from the supercritical state without via a liquid phase, pattern collapse due to exposure to a gas-liquid interface can be prevented.

This invention can be applied to substrate processing apparatuses in general for processing a substrate using a processing fluid introduced into a chamber. Particularly, the invention can be applied to a process using a high-pressure fluid, e.g. a substrate drying process of drying a substrate such as a semiconductor substrate by a supercritical fluid.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing apparatus for processing a surface of a substrate by a processing fluid, comprising:
    a substrate holder in the form of a flat plate, the substrate being placeable in a horizontal posture on an upper surface of the substrate holder;
    a chamber including a processing space capable of accommodating the substrate holder having the substrate placed thereon and a side surface having an aperture that communicates with the processing space and allows the substrate holder to pass through; and
    a lid part configured to close the aperture by coming into contact with the chamber via a sealing member,
    wherein:
    the substrate holder projects on a chamber side surface of the lid part and the lid part closes the aperture with the substrate holder inserted in the processing space,
    the chamber is provided with an introduction flow passage for receiving the processing fluid from outside the chamber and introducing the processing fluid into the processing space,
    the introduction flow passage is open to the processing space on a side further backward than the substrate in the processing space when viewed from the aperture,
    a ceiling surface of the processing space and an upper surface of the substrate holder are facing each other in parallel across a gap on a side closer to the aperture than the substrate in the processing space, thereby forming an upper flow passage having a constant flow passage cross-sectional shape, the processing fluid having passed above the substrate flowing in the upper flow passage,
    the upper flow passage is formed by being surrounded by the lid part, the chamber and the sealing member and connected to a buffer space having a larger flow passage cross-sectional area than the upper flow passage, and
    a discharge flow passage for discharging the processing fluid to the outside of the chamber is connected to the buffer space.

2. The substrate processing apparatus according to claim 1, wherein a flowing direction of the processing fluid is changed by 90 degree or more in a connecting part of the upper flow passage and the buffer space.

3. The substrate processing apparatus according to claim 1, wherein:
    a recess retracted further than an opening surface of the aperture is formed above the aperture in the side surface of the chamber, and
    the sealing member and the lid part arranged above the recess close the recess to form the buffer space.

4. The substrate processing apparatus according to claim 3, wherein a width of the recess is equal to or larger than an opening width of the aperture in a horizontal direction.

5. The substrate processing apparatus according to claim 3, wherein the processing space and the recess are separated by a separation wall in the form of a horizontal flat plate.

6. The substrate processing apparatus according to claim 5, wherein a size of a clearance between a tip of the separation wall and the lid part is equal to a size of a gap between the ceiling surface of the processing space and the upper surface of the substrate holder.

7. The substrate processing apparatus according to claim 1, wherein:
- a lower surface of the substrate holder and a bottom surface of the processing space are facing each other in parallel across a gap on the side closer to the aperture than the substrate in the processing space, thereby forming a lower flow passage having a constant flow passage cross-sectional shape, the processing fluid having passed below the substrate flowing in the lower flow passage,
- the lower flow passage is formed by being surrounded by the lid part, the chamber and the sealing member and connected to a lower buffer space having a larger flow passage cross-sectional area than the lower flow passage, and
- a lower discharge flow passage for discharging the processing fluid to the outside of the chamber is connected to the lower buffer space.

8. The substrate processing apparatus according to claim 1, wherein the processing fluid is a supercritical fluid.

* * * * *